United States Patent
Udy

(10) Patent No.: US 7,595,111 B2
(45) Date of Patent: Sep. 29, 2009

(54) METHODS TO CONTINUOUS, MONOATOMIC THICK STRUCTURES

(76) Inventor: Joseph Dale Udy, 4466 S. Helena Way, Apt. 362, Aurora, CO (US) 80015-4415

(*) Notice: Subject to any disclaimer, the term of this patent is extended or adjusted under 35 U.S.C. 154(b) by 461 days.

(21) Appl. No.: 11/243,285

(22) Filed: Oct. 4, 2005

(65) Prior Publication Data

US 2006/0269740 A1 Nov. 30, 2006

Related U.S. Application Data

(63) Continuation-in-part of application No. 10/079,376, filed on Feb. 20, 2002, now abandoned.

(51) Int. Cl.
*B32B 9/00* (2006.01)

(52) U.S. Cl. .................... 428/408; 977/742

(58) Field of Classification Search .......... 428/408; 423/447.1, 447.2, 447.4
See application file for complete search history.

(56) References Cited

U.S. PATENT DOCUMENTS

| | | | |
|---|---|---|---|
| 3,762,941 A | 10/1973 | Hou | 117/93.1 CD |
| 4,041,220 A | 8/1977 | Armand | 429/320 |
| 4,300,621 A | 11/1981 | Wilson | 164/485 |
| 5,457,343 A | 10/1995 | Ajayan et al. | 257/734 |
| 5,942,286 A | 8/1999 | Ohno et al. | 427/352 |
| 6,309,423 B2 | 10/2001 | Hayes | 23/23.75 |
| 6,316,098 B1 | 11/2001 | Yitzchaik et al. | 428/339 |
| 6,342,313 B1 | 1/2002 | White et al. | 428/701 |
| 6,582,673 B1 * | 6/2003 | Chow et al. | 423/445 R |
| 2005/0238565 A1 * | 10/2005 | Sullivan | 423/447.1 |

OTHER PUBLICATIONS

Science 294,828, Oct. 26, 2001, M. M. Boorum, et al. "Groundwork for a Rational Synthesis of $C_{60}$ : . . . ".
"Carbon Wonderland" by A. Geim and P. Kim, Apr. 2008, Scientific American, p. 90-97. 8 pages.

* cited by examiner

*Primary Examiner*—Jennifer McNeil
*Assistant Examiner*—Daniel Miller

(57) ABSTRACT

Continuous, monoatomic thick graphite sheets/ribbons are produced utilizing laser desorption/ionization techniques. These techniques and others are generalized toward production of continuous, monoatomic/monomolecular thick structures.

3 Claims, 3 Drawing Sheets

11

12   16   20

12   16   20   16   22

12   16   20   34

METHODS TO CONTINUOUS, MONOATOMIC THICK STRUCTURES

This is a Continuation-in-Part Application in patent application Ser. No. 10/079,376 of Joseph D. Udy filed Feb. 20, 2002.

BACKGROUND

1. Field of Invention

Figure 7:
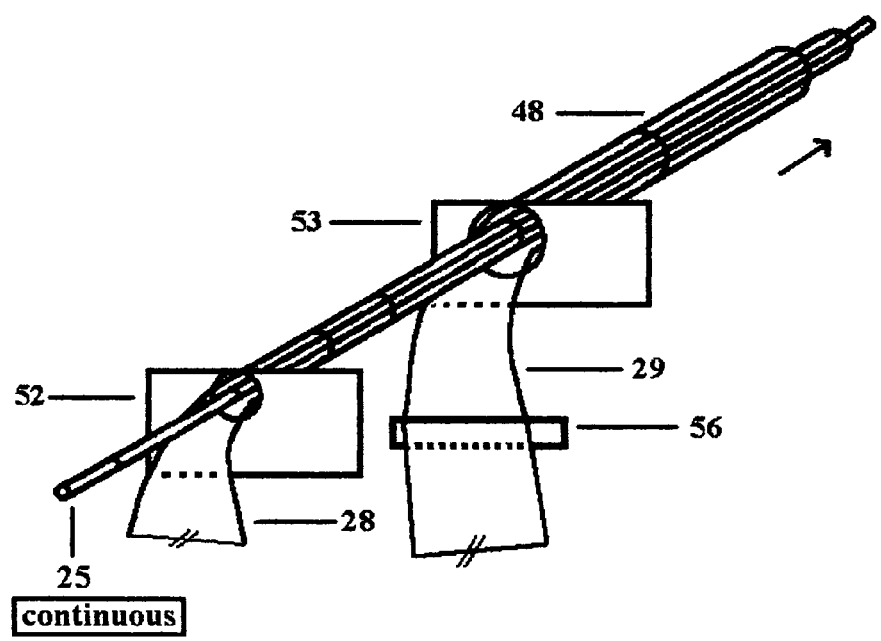

This invention relates to methods of creating one-atom/molecule thick, continuous structures, specifically to methods of creating continuous, monoatomic thick, sheets or ribbons of graphite, of any desired width, and to an embodiment, of these methods; appropriately joining the edges of the graphite ribbon(s) (to itself) to create concentric, continuous, monoatomic thick wall, graphite tubes, FIG. 7.

2. Discussion of Prior Art

Molecular/atomic beam epitaxy methods and pulsed laser deposition methods have been used to deposit very thin layers of material, in some cases, one molecule/atom thick, onto various substrates, usually with small surface area (U.S. Pat. No. 6,316,098, "Molecular layer epitaxy method and compositions", to Yitzchaik, et al., 2001 Nov. 13 and U.S. Pat. No. 6,342,313, "Oxide films and process for preparing same" to White, et al., 2002 Jan. 29). Some wet chemical methods will deposit a layer of material, sometimes one atom/molecule thick, onto a substrate or floating on a liquid surface (U.S. Pat. No. 5,942,286 "Method for manufacturing organic monomolecular film", to Ohno, et al., Aug. 24, 1999). Continuous filament is described in U.S. Pat. No. 6,309,423, "Self-cohering, continuous filament non-woven webs", to Hayes, 2001 Oct. 30.

Ajayan et al., U.S. Pat. No. 5,457,343, "Carbon Nanotubule Enclosing a Foreign Material" describes " . . . carbon tubule comprises a plurality of tubular graphite monoatomic sheets coaxially arranged." These carbon tubules and the graphite monoatomic sheets are closed (not, repeat, not continuous), as described in Col. 3, lines 4-5 and Col. 3, lines 43-44 and Col. 5, lines 44-48, and Col. 5, lines 63-66. Being closed, these carbon tubules and the coaxial and cylindrical graphite carbon monoatomic sheets are not, repeat, not continuous and do not anticipate this present/instant invention. The Applicant submits that the property of "continuousness" is a distinguishing characteristic, i.e., continuous, quartz optical fiber is different from quartz particles, beach sand.

Hou, U.S. Pat. No. 3,762,941, "Modification of Carbon Fiber Surface Characteristics", Col. 3, lines 28-31 " . . . the carbonaceous fibrous material may assume the configuration of a continuous length of a multifilament yarn, tow, tape, strand, cable, or similar fibrous assemblage." Hou does not infer or describe methods to continuous, monoatomic thick structures or continuous, monoatomic thick graphite sheets, ribbons, or tubes. In col. 5, lines 63-65, "The preferred inert gases are monoatomic, . . . ". Hou does not infer or describe continuous, monoatomic thick structures or continuous, monoatomic thick graphite sheets, ribbons or tubes.

The Applicant submits that the property of being "monoatomic" is a distinguishing characteristic and that monoatomic, nanoscale structures are different from human scale structures, e.g., a VLSI wafer (Very Large Scale Integrated circuit chip) is different from a rock.

Armand, U.S. Pat. No. 4,041,220, Aug. 9, 1977, (Col. 12, lines 24-32 and Col. 1, lines 43-50) reads; " . . . n has a value equal to or higher than a minimum value which is a function of the initial binding energy between graphite and the corresponding compound M'yXz this value not exceeding however that corresponding to the formation of continuous monomolecular graphite layers interposed between the layers of the compound M'y Xz in the corresponding compound Cn(M'yXz) . . . ". Armand uses this same, verbatim, language in two other places in the patent. Armand does not, repeat not describe the methods for creation of "continuous monomolecular graphite sheet, or ribbon, or tubes". Armand describes the graphite (Col. 7, lines 60-65) as " . . . The fineness of the particles of the graphite powder enabled said mixture . . . " and (Col. 9, lines 9-10) " . . . graphite in the form of fine flakes whose particle sizes were less than 80 microns . . . " and (Col. 9, lines 45-48) " . . . pressing a powder for the graphite mixed compound . . . " and (Col. 11, lines 42-45) " . . . flakes . . . of graphite . . . shaped by cold pressing . . . ". Armand, in toto, teaches (classical chemical mixtures and methods) away from this present/instant invention. Armand is not, repeat not, proposing or creating continuous, monoatomic structures. Armand's total discourse on the subject, uses the same words in three places (see above).

Armand, '420, merits literal and narrow interpretation.

Armand, does not, repeat not contain the language: continuous, monoatomic ribbon, continuous, monoatomic graphite ribbon or concentric, continuous monoatomic graphite tubes.

Further, Armand does not, repeat not, infer the concepts of or methods to: continuous, monoatomic ribbon, continuous, monoatomic graphite ribbon or sheet or concentric, continuous graphite tubes, with slightly increasing diameters. The present/instant invention describes methods to continuous monoatomic structures: ribbons, and sheets, and continuous, concentric, monoatomic graphite tubes, which are beyond the horizon/outside the envelope of the Armand reference, see above. Further, the present invention discloses a "new approach/dimension/facet/perspective" toward methods to continuous monoatomic structures that is far different/beyond, even contrary, to the Armand "classical" reference.

For example, Armand employs thermal diffusion (Example 1) and solvent diffusion (Example 2, 3) techniques (both, Example 4) to create powdered graphite mixtures, which are pressure molded to desired form (Examples 5-6).

All classical methods, used in a "batterycentric" perspective.

This instant/present invention, uniquely describes methods to continuous, monoatomic ribbon, continuous, monoatomic graphite ribbon and concentric, continuous, monoatomic thick wall, graphite tubes.

Wilson, U.S. Pat. No. 4,300,621, Nov. 17, 1981 (Class 164, sub 485, is far removed in perspective from this instant invention), demonstrates a "mold-centric" perspective. Wilson (west/web version, page 4, lines 3-4) reads; " . . . mold bodies comprise tubular graphite members of increasing diameter in concentric relationship . . . ", "members" (Wilson '621), by definition, "member" defined as " . . . constituent parts . . . "; (thereby not, repeat not continuous) pg 833, Random House Dictionary, College, 1968).

This instant invention, methods to concentric, continuous, monoatomic thick wall graphite tubes, is patentably distinct from the " . . . tubular graphite members . . . " of Wilson '621. Wilson does not, repeat not, disclose relevant methods.

There is no suggestion in the prior art to justify the reinterpretation and/or redefinition of the above common language definitions.

The hindsight perspective from this instant invention does not, repeat not, condone, enbale, or justify, the revision of the above common language definitions.

The above prior art does not contain or infer methods to "continuous, monoatomic ribbon" or "continuous, monoatomic graphite ribbon", or "concentric, continuous, monoatomic thick wall graphite tubes" or describe methods of creating continuous, monoatomic/monomolecular structures, stacked orthogonally or concentrically or as spiral tubes, to form continuous synergistic strata.

Graphite exists naturally " . . . in two forms: foliated and amorphous . . . in general, artificial graphite made at high temperature in the electric furnace is now preferred for most uses because of its purity." (Materials Handbook, 10th Edition, G. S. Brady. pg. 374).

SUMMARY

Continuous sheet/ribbon structures, one-atom/molecule thick, are formed by laser desorption/ionization (LDI) of precursor molecules/atoms.

OBJECTS AND ADVANTAGES

This instant invention discloses an approach to the creation of continuous, monoatomic thick structures and a method of creating continuous, monoatomic thick, sheet and ribbon, one embodiment of continuous, monoatomic ribbon production is the creation of concentric, continuous, monoatomic tubes (same methods, different application geometries). Prior art does not contain the language/concepts above, nor, "concentric, continuous, monoatomic thick graphite tubes", nor, "continuous, monoatomic graphite ribbon", nor methods to these structures.

Graphite is very strong along the two dimensions of its structural plane. The production of continuous sheets/ribbons/tubes of graphite would allow the fabrication of high-strength, lightweight structures.

Graphite conducts heat and electricity along the two dimensions of it's structural plane. The production of continuous sheets/ribbons/tubes of graphite would allow the fabrication of unique, heat, and/or electricity conducting devices/structures.

DRAWINGS

Three drawings sheets, containing FIGS. 1-8, accompany this application.

DRAWINGS DESCRIPTION—BRIEF

Figure 1:
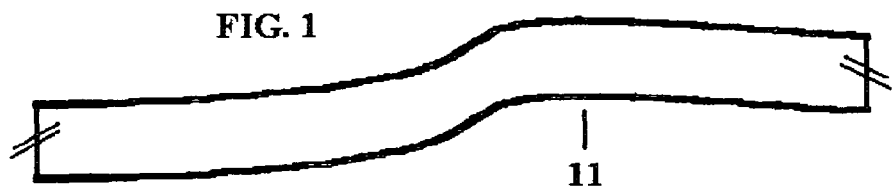
Figure 2:
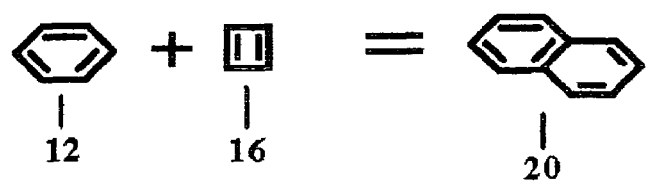
Figure 3:
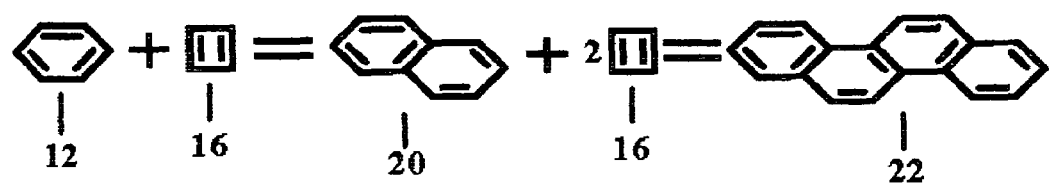
Figure 4:
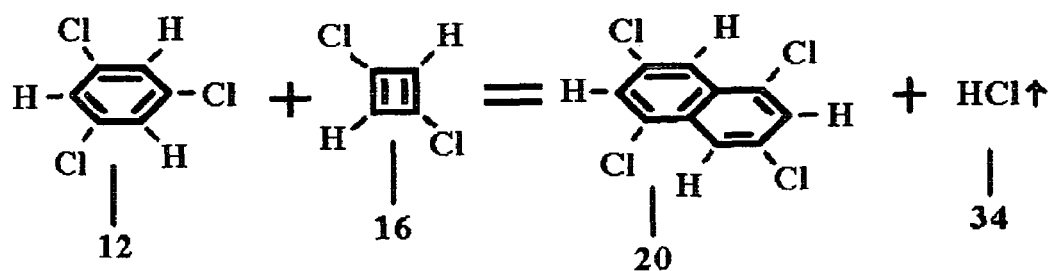
Figure 5:
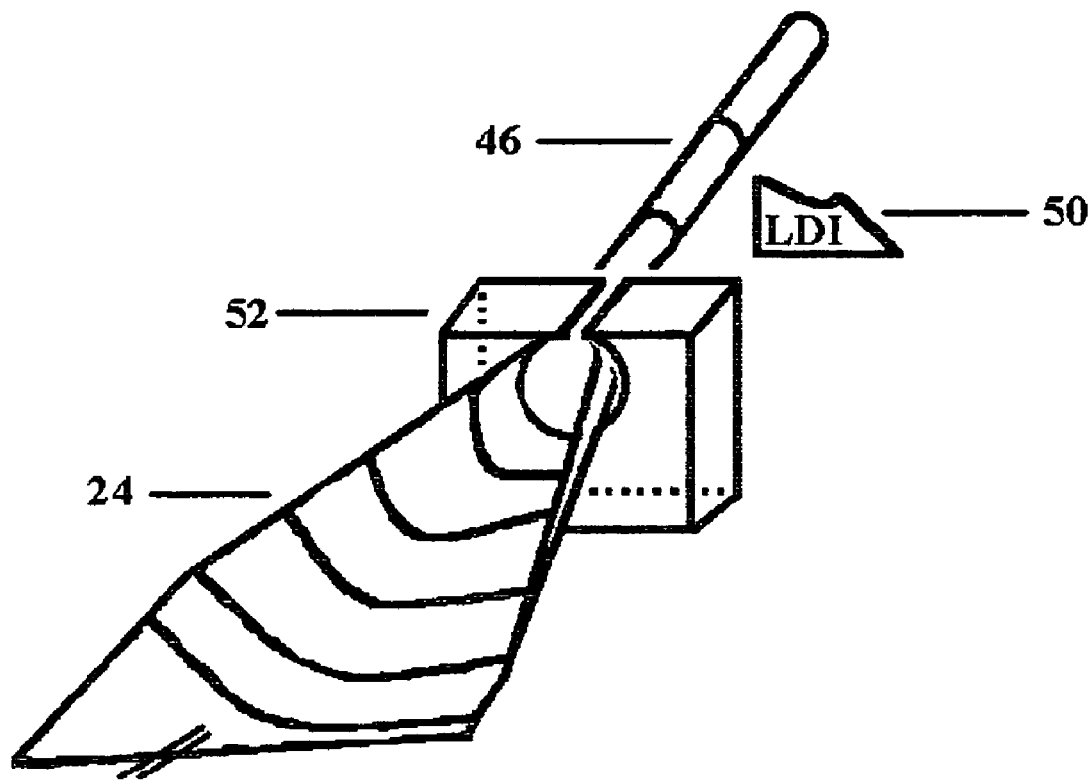
Figure 6:
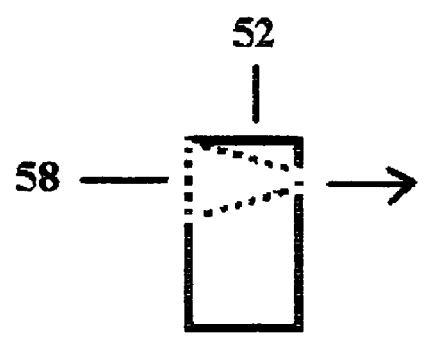
Figure 8:
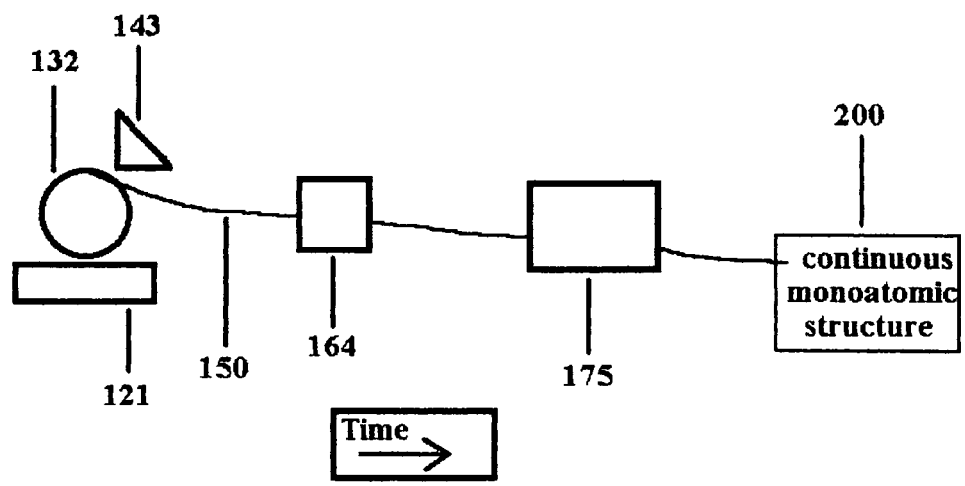

FIG. 1 a schematic of continuous, monoatomic ribbon;

FIG. 2 a schematic detail of graphite nanoribbon formation (continuous step);

FIG. 3 a schematic detail of continuing graphite ribbon formation (continuous step);

FIG. 4 a schematic detail of graphite ribbon formation including other elements/reactants (LDI dehalogenation reaction);

FIG. 5 a schematic of graphite ribbon being drawn through a die, to form a graphite tube (LDI dehalogenation reaction at ribbon edges);

FIG. 6 a schematic detail of the die, illustrating the funnel or cone shaped forming channel;

FIG. 7 a schematic of the formation of concentric, continuous graphite tubes;

FIG. 8 a schematic overview of continuous, monoatomic structure creation.

DRAWINGS NUMBERS KEY

11 Schematic of continuous, monoatomic/molecular ribbon FIG. 1

12 1,3,5-trichlorobenzene FIG. 2

16 1,3-dichloro-tetradiene FIG. 2

20 monoatomic graphite nanoribbon, halogenated FIG. 2

22 continuous, monoatomic graphite ribbon FIG. 3

24 process ready, continuous, monoatomic graphite ribbon FIG. 5

25 core of prior formed continuous, monoatomic graphite tube FIG. 7

28 predetermined width, w2, process ready, continuous, monoatomic graphite ribbon FIG. 7

29 predetermined width, w3, process ready, continuous, monoatomic graphite ribbon FIG. 7

34 hydrogen chloride gas FIG. 4

46 continuous, monoatomic graphite tube FIG. 5

48 concentric, continuous, monoatomic graphite tubes FIG. 7

50 LDI (laser desorption/ionization) apparatus/means FIG. 5

52 forming die FIG. 5-7

53 forming die FIG. 7

56 saturation/cryogenic saturation/vapor coating, etc., of transient species onto graphite ribbon surface prior to graphite tube formation FIG. 7

58 cone or funnel shaped forming channel, (may be open at top) FIG. 6

121 precursor material(s) FIG. 8

132 formation surface, (optional) FIG. 8

143 activation means FIG. 8

150 continuous, monoatomic thick structure, initial formation FIG. 8

164 inspection means FIG. 8

175 structure correction means FIG. 8

200 continuous, monoatomic thick structure, inspected and corrected FIG. 8

DESCRIPTION OF DRAWINGS—DETAILED

FIG. 1 a schematic of continuous, monoatomic ribbon, 11, illustrating the two-dimensional character of monoatomic/monomolecular thick continuous ribbon, the width of the ribbon is a design choice/application dependent.

FIG. 2 a schematic detail of graphite ribbon formation, illustrating the carbon skeleton of 1,3,5-trichlorobenzene, 12, and 1,3-dichloro-tetradiene, 16, self-assembling to form graphite nanoribbon, 20, as a continuous step.

FIG. 3 a schematic detail of continuing, monoatomic graphite ribbon formation, illustrating one possible route of continuous, monoatomic graphite ribbon, 22, formation, as continuous steps.

FIG. 4 a schematic detail of graphite ribbon formation including other elements/reactants, illustrating the hydrogen and chlorine on the precursors and the self-assembly side product of hydrogen chloride gas, 34, which is drawn off, and may be recycled.

FIG. 5 a schematic of continuous, monoatomic graphite ribbon, 24, being drawn through a die, 52, (LDI dehalogenation at ribbon edges) to form a continuous, monoatomic wall graphite tube, 46. Also illustrating a continuous, monoatomic graphite ribbon, 24, of predetermined size being drawn/pulled through the forming channel of a die, 52, both of predetermined size. Among other methods, consisting of the group of dehalogenation methods and bonding methods, lasers may the directed to ionize and dissociate the hydrogen and chlorine ions from the edge of the graphite ribbon, and facilitating the formation of continuous graphite tube, 46.

FIG. 6 a schematic detail of the die, 52, illustrating the funnel or cone shaped forming channel, 54, of a predetermined size, in a section perspective, which "roll" (in the continuous/long axis) the ribbon onto itself, bringing the ribbon edges together for bonding (creating a continuous tube). The slot/opening at the top of the die may allow LDI on the approaching edges interface and the running bonding of the ribbon edges (creating a continuous tube).

FIG. 7 a schematic of one approach to the formation of concentric, continuous graphite tubes, 48, illustrating the sequential formation of concentric, continuous graphite tubes, 48, around/over the core, 25, of prior formed concentric, continuous graphite tubes. The process ready, continuous, graphite ribbons, 28 and 29, may be "modified", 56, modification means, (additives/vapor coated/implanted/saturated with transient species/"doped"/etc., as needed) independently/separately and appropriately for the intended/desired application, as the concentric, continuous graphite tubes, 48 are formed.

FIG. 8 a schematic overview of continuous, monoatomic structure creation, illustrating a precursor material(s) source/means, 121, and, a clockwise rotating, drum formation surface (optional), 132, and, a precursor activation means, 143, creating the initial formation of the continuous, monoatomic structure, 150, and, a continuous, monoatomic structure inspection means (Millipede arrays R), 164, and, a continuous, monoatomic structure correction means (continuous, monoatomic structural flaw, correction means, variation of Millipede arrays R), 175, and, the inspected and corrected (repaired) continuous, monoatomic structure, 200.

Description

The lower surface of a cylinder or drum is in contact with a reservoir of precursor. As the drum rotates, a thin layer of precursor coats the surface of the drum. The precursor on the top surface of the coated, rotating drum is irradiated with lasers. Laser desorption/ionization activates the precursor which polymerizes or "self-assembles" into a monoatomic thick sheet/ribbon on the drum surface, (Additional activation methods/means include heat, pressure, catalysts, reactive species, enzymes, and combinations, etc.), this monoatomic sheet/ribbon structure is formed continuously as the drum rotates, and the reservoir of precursor is maintained in contact with the lower surface of the drum.

This continuous sheet/ribbon structure is drawn off the drum surface as it is formed and used as needed or collected (by winding it onto a take-up roll, etc.).

This present invention may also be described as continuous, monoatomic/monomolecular structures. The structure/material of the above, further including: continuous, monoatomic thick, graphite sheet, and ribbon. A method of producing continuous, monoatomic/monomolecular thick structures comprising the steps of: providing precursor, and;

providing activation of the precursor material, whereby continuous, monoatomic/monomolecular thick structures are produced.

The method according to the above, further comprising the steps of: providing formation surfaces for the continuous, monoatomic structure formation, and; providing laser desorption/ionization to activate the precursor material.

A method of producing continuous, monoatomic thick graphite comprising the steps of: providing 1,3,5-trichlorobenzene and 1,3-dichloro-cyclotetradiene (combined in a cryogenic ice), as a precursor material to a formation surface, and; providing laser desorption/ionization to activate the precursor material on the formation surface; whereby said precursor material forms continuous, monoatomic thick graphite sheet or ribbon.

These continuous, monoatomic/monomolecular structures/materials may be made with almost any material/member or combination of materials/members from the group including, elements and organic chemicals and inorganic chemicals and matter, there could be a large number of embodiments, each material (named a "monomaterial or monostructure") would likely have unique and useful properties.

This present invention may be further described as: the structure of continuous, monoatomic thick ribbon and the structure of continuous, monoatomic thick graphite ribbon and the structure of concentric, continuous, monoatomic thick graphite tubes, with slightly increasing diameters.

A method of creating a continuous monoatomic thick structure comprising the steps of: providing an appropriate formation surface; and providing a precursor material on said formation surface; whereby said precursor material self assembles to create a continuous monoatomic thick structure.

A method of creating continuous monoatomic thick structures comprising the steps of: providing an appropriate formation surface; providing a precursor material(s) on said formation surface; and providing activation means of said precursor material; whereby said precursor material assembles to create a continuous monoatomic thick structure.

The information surface of above wherein said formation surface includes the surface of a rotating stainless steel drum.

The precursor material(s) of above wherein said precursor material(s) include 1,3,5-trichlorobenzene and 1,3-dichloro-cyclotetradiene. The activation means of above wherein said activation means include laser desorption and ionization.

The continuous monoatomic thick structure of above wherein said structure includes graphite sheet and ribbons.

The graphite ribbons of above wherein said ribbon is joined at the edges, whereby concentric, continuous, monoatomic thick, graphite tubes are created.

A method of creating continuous monoatomic thick structures comprising the steps of: providing a precursor material(s);

providing activation means of said precursor material;

providing an inspection means of said structure; and providing structure correction means, optional;

whereby said precursor material is assembled to create a continuous, monoatomic thick structure.

Operation

A rotating drum, likely stainless steel, the same length as the desired width of the graphite sheet, is barely immersed in a reservoir (source) of 1,3,5,-trichlorobenzene and 1,3-dichloro-cyclotetradiene. As the drum rotates, the lower surface of the drum is wetted by the trichlorobenzene and dichloro-cyclotetradiene. At the top of the rotation cycle, the 1,3,5,-trichlorobenzene and 1,3-dichloro-cyclotetradiene on the drum surface is irradiated with (nitrogen) lasers (laser desorption/ionization) with a wavelength about 337 nm (or other bond absorbance/resonant frequencies) and with laser fluences adjusted to maximize, continuous, monoatomic graphite ribbon/sheet (structure) formation, likely at the threshold for ion formation (precursor activation means). The hydrogen and chlorine ions are desorbed (dehalogenation), and combine (self assemble) to form hydrogen chloride gas that is removed and recycled, or bubbled through sodium hydroxide solution, to form sodium chloride (salt) and water.

The benzene/graphite ions and tetradiene ions, which never really exist separately, combine to form a continuous, one-atom thick graphite ribbon/sheet. It is likely that this formation of the graphite sheet would be an example of "self-assembly". (A second set of lasers, at the resonance frequency of the benzene/graphite ions may be needed). As the graphite sheet/ribbon is continuously formed, it is continuously drawn off and used as needed or collected (wound onto a take-up roll, collection means and/or storage means, etc.).

A series of scanning, tunneling microscope arrays, for example, IBM Millipede arrays R (inspection means) would likely be needed to visualize the graphite sheet. If zero defects are required in the graphite sheet, atomic force microscope probes (a variation of Millipede arrays R) could likely repair any structure defects (correction means) before the graphite ribbon/sheet is used or wound onto the take-up roll.

This monoatomic graphite ribbon/sheet formation procedure would likely require a nitrogen and oxygen free atmosphere to reduce defects in the graphite structure. A low temperature drum surface, in the area of the laser irradiation, may reduce defects in the graphite structure. Also, a static, thin layer of graphite on the drum surface, to act as a template for the continuous graphite sheet formation, may reduce defects.

A slight electrical charge (perhaps pulsed) on the drum may also reduce defects. Very short laser pulses, picosecond or femtosecond, may reduce defects.

Alternatively, if continuous, monoatomic graphite ribbons are desired, the laser irradiation (LDI) could be restricted to the desired ribbon width. "Shaving" or cutting (desorption) of a continuous, monoatomic ribbon/sheet from a parent surface/precursor material may also utilize LDI.

Preferred Embodiment

Method/means providing for/illustrated in FIG. 7, the precursor material is continuous, monoatomic ribbon, 28 & 29, and the formation means are the draw dies, 52 & 53. The activation means, is LDI at the ribbon(s) edges to create concentric, continuous, monoatomic graphite tubes.

Alternate Embodiments

Method/means could include variations of the groups consisting of (but not limited to or required):

Structure—sheets, ribbons, tubes,—basic form structures—with/from which most other structures can be built/formed;

Formation surfaces—drums (stainless steel, copper, glass, plastic, etc.), flat coat surfaces (static, spinning, etc.), vapor deposition surfaces, liquid surfaces (water, liquid metal, immiscible bath surfaces, etc.), energized surfaces (ultrasonic, microwave, etc.), dies, interface surfaces;

Activation means—lasers, radiation, heat, pressure, catalysts, reactive species, enzymes, and combinations; and Desorption and ionization and bonding methods/means, among others.

CONCLUSION, RAMIFICATIONS AND SCOPE

It is likely that other materials including: silicon, boron, sulfur, proteins and others/combinations can be formed into monoatomic/molecular thick, continuous sheets with appropriate activation methods and formation surfaces. These efforts may spur new research in both organic and inorganic continuous sheet alloys and/or synergistic strata.

Graphite conducts electricity, and might be used as a wiring grid for nanocircuits, by optimally placing components on a graphite sheet and then photoetching out undesired connections.

A continuous ribbon of graphite could be created the same width as the circumference of a carbon nanotube. Laser desorption/ionization could likely be used to attach the two edges of the graphite ribbon together, thereby creating a continuous graphite nanotube. This protocol could likely be used to create graphite tubes of any diameter. A thread, rope or wire of concentric, layered, continuous graphite tubes, with slightly increasing diameters, may be superconducting, with appropriate "doping", a type/class of synergistic strata.

Continuous graphite sheets could likely be molded/formed into/to any compound shape. Many cylindrical structures including, gun barrels and aircraft/rocket bodies could be created by winding a continuous graphite sheet around an appropriate sleeve or form. These graphite layers could be laminated (glued together) or possibly allowed to move with respect to adjacent layers thereby dissipating energy (perhaps in body armor) and likely reducing vibration and fatigue-cracking problems, a type/class of synergistic strata.

A few layers of graphite sheet would likely create an air barrier, appropriate for use as aircraft wing skin, boat sails, balloons, or kites, etc. Continuous graphite sheet(s) may have interesting uses as "filters" and/or permeable membranes, perhaps in batteries or fuel cells.

Continuous monomolecular sheets of explosives may have interesting properties, useful in some manufacturing processes etc.

Generically, these continuous monoatomic/molecular sheets, or ribbons, or tubes, and other forms/structures may be considered "mother nature" in two dimensions and these methods as two dimensional engineering.

The invention claimed is:

1. A method of creating continuous, monoatomic thick, graphite ribbon/sheet structures comprising the steps of:
   providing a rotating drum with a static layer of graphite as a formation surface for graphite ribbon/sheet, and,
   providing precursor material(s) of graphite ribbon/sheet on said formation surface, and,
   providing activation by laser means of said precursor material, whereby said precursor material assembles to create a continuous monoatomic thick graphite ribbon/sheet structure.

2. Sequentially joining the appropriate edges of successive graphite ribbons of claim 1, providing the sequential, concentric formation of layered, continuous graphite tubes.

3. A method of creating continuous, monoatomic thick, substantially graphite-like ribbon/sheet structures comprising the steps of:
   continuously providing a precursor material(s) of said substantially graphite-like ribbon/sheet structure, and,
   providing activation by laser means of said precursor material, and,
   providing microscopic structure correction means,
      whereby said precursor material is assembled to create a continuous, monoatomic thick, substantially graphite-like ribbon/sheet structure.

* * * * *